United States Patent [19]
Chang

[11] Patent Number: 5,663,678
[45] Date of Patent: Sep. 2, 1997

[54] ESD PROTECTION DEVICE

[75] Inventor: Ming-Chien Chang, Hsinchu, Taiwan

[73] Assignee: Vanguard International Semiconductor Corporation, Hsin-chu, Taiwan

[21] Appl. No.: 595,701

[22] Filed: Feb. 2, 1996

[51] Int. Cl.[6] .................... H02H 3/20; H02H 9/04
[52] U.S. Cl. ............................. 327/566; 327/313
[58] Field of Search .................... 371/56, 58, 91; 327/111, 566, 310, 313, 318

[56] References Cited

U.S. PATENT DOCUMENTS

| | | | |
|---|---|---|---|
| 4,692,834 | 9/1987 | Iwahashi et al. | 361/91 |
| 4,811,155 | 3/1989 | Kuriyama et al. | 361/56 |
| 4,829,350 | 5/1989 | Miller | 361/91 |
| 4,855,620 | 8/1989 | Duvvury et al. | 361/91 |
| 5,051,860 | 9/1991 | Lee et al. | 361/58 |
| 5,157,573 | 10/1992 | Lee et al. | 361/56 |
| 5,208,475 | 5/1993 | Mortensen | 257/360 |
| 5,565,698 | 10/1996 | Obermeier | 257/360 |

Primary Examiner—Timothy P. Callahan
Assistant Examiner—T. T. Lam
Attorney, Agent, or Firm—George O. Saile; William S. Robertson

[57] ABSTRACT

An FET with a lightly doped drain is connected between an input/output pad and ground and is protected from ESD at a pad by a structure that includes a resistor formed by the process step for the lightly doped drain. The resistor adjoins and interconnects a diffusion underlying the pad and the diffusion for the drain of the FET. A parasitic bipolar transistor is formed by the pad diffusion, the source diffusion for the FET, and the intervening substrate. When an ESD voltage appears at the pad, the FET conducts in circuit with the resistor and the voltage drop across the resistor helps to protect the FET and to turn on this parasitic bipolar transistor (in preference to a parasitic bipolar transistor otherwise formed by the FET) and thereby hold down the ESD voltage at the pad and at the drain of the FET. The FET and resistor can be formed as a number of parallel connected FETs and resistors located symmetrically on opposite sides of the pad diffusion. Protection for an input inverter circuit is also provided.

10 Claims, 1 Drawing Sheet

5,663,678

ESD PROTECTION DEVICE

FIELD OF THE INVENTION

This invention relates generally to semiconductor circuit devices. It relates more specifically to a circuit for protecting the input/output (I/O) circuits of a semiconductor chip from the voltage of an electrostatic discharge (ESD).

INTRODUCTION

An electrostatic discharge can appear at the I/O terminals (pads) of a semiconductor chip, and protecting a semiconductor circuit from ESD is a familiar problem. Commonly, the operating circuits are coupled to the pad through a resistor that produces a voltage drop while it conducts the ESD current and thereby helps to reduce the ESD voltage at the operating circuits. The operating circuits connected closest to a pad are ordinarily an output circuit and/or an input circuit. The output circuit supplies a signal through the pad and associated external wiring to other components. The input circuit receives the signal at the pad and transmits it to other circuits on the chip.

It is also a common practice to connect a switchable device to the pad to conduct the ESD current in a path that bypasses the operating circuits. Commonly, a transistor is connected between one of the power supply terminals (e.g. ground) and the common connection of the resistor and the operating circuits. When an ESD voltage appears at the pad, the switchable device turns on and thereby tends to hold down the voltage at the operating circuits.

It is a general object in this art to reduce the size of the ESD protection components because the components must be large enough to conduct a sufficient current to protect the operating circuits, and because one protection circuit may be required for each pad.

THE PRIOR ART

Lee U.S. Pat. No. 5,157,573 teaches an output buffer circuit that has several parallel connected n-channel FETs 24 connected to pull down the voltage of an output pad 10 and a p-channel FET 14 connected to pull the pad voltage up. ("Pull up" and "pull down" are a generalization of the two voltages that represent binary logic values in these circuits.) These FETs are commonly lightly doped drain (LDD) FETs. A thick oxide snap back device 26 is connected to conduct an ESD current from the pad to ground. Each pull down FET 24 has a resistor 22 connected between its drain terminal and the pad. These resistors help to isolate the pull down FETs from an ESD voltage at the pad, as described in the preceding introduction. The resistors are formed by an n-well located between a p-well for the pull down FETs and a p-well for the snap back device 26.

Mortensen U.S. Pat. No. 5,208,475 teaches an output buffer with a pull up FET 65 (FIG. 9) and a pull down LDD FET 66 that are protected by a non-LDD FET 120 and a corresponding parasitic bipolar transistor 78 connected to conduct an ESD current from the pad to ground. The gate of FET 120 is connected to ground and this transistor turns on when an ESD voltage causes a break down to occur at its channel-drain junction. The parasitic bipolar transistor 78 turns because its base-emitter junction breaks down.

SUMMARY OF THE INVENTION

An important object of this invention is to provide a protection circuit that has a compact structure and takes only a small area of a semiconductor device.

One factor that makes the circuit compact is that it does not use a non-LDD protection device of the known prior art and it uses a compact layout LDD n⁻ series resistor.

Another object of the invention is to provide a simpler process for manufacturing a device with an ESD protection circuit. The structure of this invention avoids one of the implants that is used for each ESD protection device in a prior art protection device.

Another object of this invention is to provide a new and improved semiconductor structure that embodies this circuit.

The input protected circuit is intended for applications that would use the charge device model (CMD) of ESD protection. (In a test of an ESD protection device, a capacitor of a specificed value is charged to a predetermined voltage and discharged at the circuit under test. The CMD is a standard test that specifies a particular capacitance and voltage. Other standard tests include the Machine Model and the Human Body Model.)

In an embodiment of this protection circuit that uses a P-substrate, the pad overlies an n⁺ diffusion, as is conventional. The protection device has a shallow n⁻ diffusion that forms a resistor between the pad and the drain region of an output circuit. In normal operation the resistor conducts signals from the protected output circuit to the pad. In both the invention and the prior art, the resistor also conducts ESD current to the protected circuit and the voltage drop across this resistor helps to limit the voltage at the protected circuit. The voltage drop across this resistor also helps to trigger the parasitic bipolar transistor to turn on and thereby shunt the larger ESD current at the pad. Note that the parasitic bipolar transistor has its collector at the pad, where it can conduct an ESD current, and not at the drain of the FET of the protected circuit. Thus, the the drain region of the output device is protected from damage from an ESD voltage from the pad.

The gates of an input circuit are particularly susceptible ESD damage, and a non-LDD NMOS for the input protected circuit is connected between these gates and ground to form a path for an ESD current and used the n⁺ diffusion that forms a resistor between the pad and the gate of the input circuit.

Other objects and features of the invention will appear in the description of the preferred embodiment of the invention.

THE DRAWING

THE PREFERRED EMBODIMENT

Figure 1:
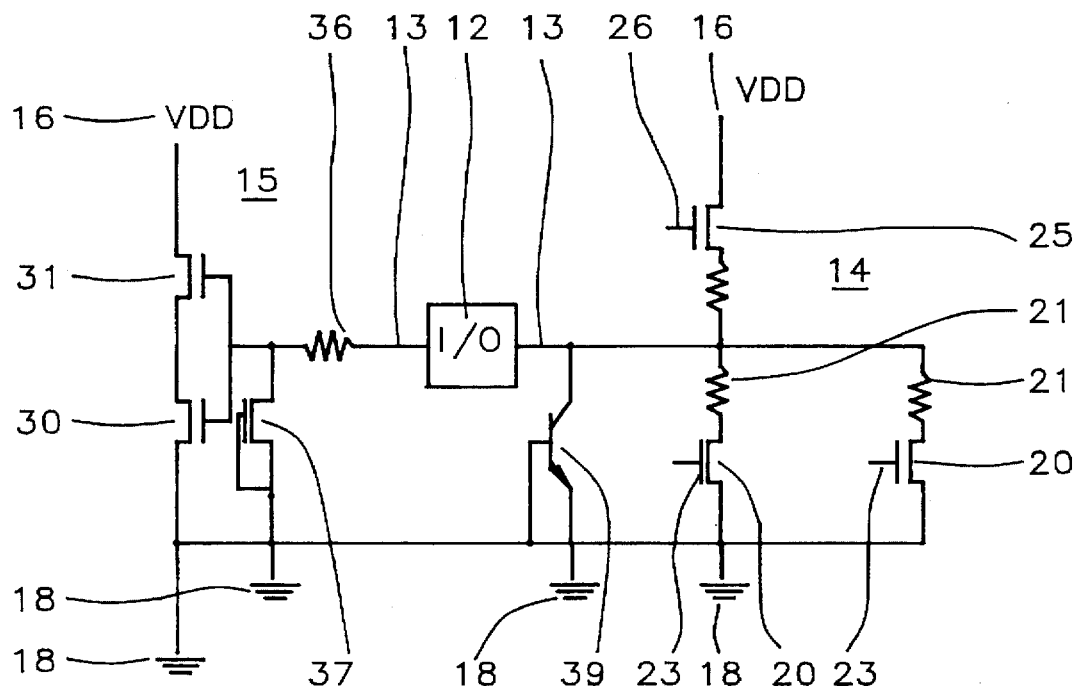
FIG. 1 is a circuit schematic of the protection device of this invention.

The Circuit of FIG. 1 —Introduction

FIG. 1 shows an I/O (input/output) pad 12, an input circuit 15 and an output circuit 14. An ESD voltage may appear at pad 12. A conductive line 13 connects both circuits 14 and 15 to pad 12 and to the protection circuit of this invention. Line 13 is shown in two parts in FIG. 1 but is preferably a single structure as will be seen in FIG. 2. The circuit module has a power supply terminal 16, $V_{DD}$, and a circuit ground 18.

A particular circuit device can have both circuits 14 and 15 and pad 12 can operate as both an input pad and an output pad, it can be formed with both circuits 14, 15 in a circuit organization in which only one of these circuits is connected to operate with pad, or it can be formed with only one of the circuits shown in the drawing.

Circuits 14 and 15 are representative of circuits that may advantageously use the ESD protection device of this invention, and they will be described in detail because their structure is closely related to the structure of the protection device.

The Preferred Protected Output Circuit—FIG. 1

The preferred output circuit 14 comprises a plurality of LDD NMOS FETs 20 each connected with an associated drain resistor 21 between line 13 and circuit ground 18. The resistors 21 are formed by an LDD $n^-$ diffusion, as will be explained in the description of FIG. 2. The gates 23 of FETs 20 are given a binary voltage that represents logic values 0 and 1 and an up level (commonly representing a binary 1) turns on the FET and causes it to conduct in its source-drain circuit and thereby pull down line 13 and pad 12.

A pull-up FET 25 similarly pulls up line 13 in response to a signal at its gate electrode. In the circuit of the drawing, this FET is an N-channel FET and it turns on in response to an up level on its gate 26. The signal at the gates 23 and 26 of FETs 20 and 25 are of opposite phase and for example FETs 20 pull line 13 down while FET 25 is turned off. A known corresponding circuit in which the pull up FETs and pull down FETs are of opposite channel types will be understood without specific explanation.

Figure 2:
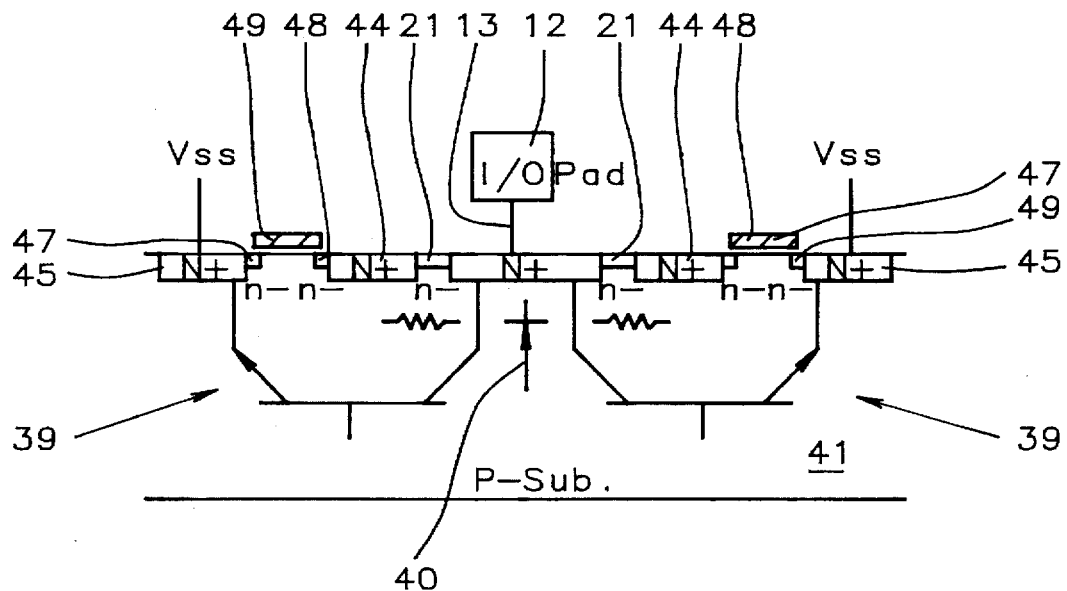
FIG. 2 is an edge view of a portion of a semiconductor device using one embodiment of this invention.

The cross section of the output device 14 is shown in FIG. 2. The parasitic npn bipolar transistor 39 is generated in the output pull up/pull down device 14 as a result of using the LDD n-channel diffusion resistor. The parasitic bipolar transistor 39 has its emitter and base connected to ground so that the transistor is normally off and it turns on in response to an ESD voltage at pad 12. ($V_{DD}$ is lower than the parasitic breakdown voltage, so the parasitic bipolar transistor 39 does not turn on during normal operation.) When an ESD voltage appears at pad 12, transistors 20 and 39 turn on and conduct the ESD current.

The Preferred Protected Input Circuit—FIG. 1

The preferred input circuit 15 is a known CMOS inverter having an n-channel FET 30 and a p-channel FET 31 with their gates connected to receive the signal at the pad 12. The common connection node of the drains of FETs 30, 31 is connected to circuits (not shown) that operate on this signal.

In the schematic drawing of FIG. 1, the protection circuit comprises a resistor 36 and an FET 37. Resistor 36 is formed by an $n^+$ diffusion and conducts between pad 12 and the common connection point for the gates of the input circuit 15 and the protection FET 37. The resistor produces a voltage drop associated with the ESD current and voltage drop helps to isolate the input 15 from the ESD voltage.

The gate of protection FET 37 is connected to ground and this FET turns on in response to an ESD voltage at pad 12. This FET structure is used with the non-LDD device 30 because its snapback voltage lower than that of LDD device and it easily turns on in response to the Charge Device Model ESD voltage at pad 12.

The Preferred Protection Circuit —FIG. 2

In the device drawing of FIG. 2, the I/O pad 12 and the connections to $V_{SS}$ (ground 18) will be recognized from FIG. 1. The preferred device is constructed with a p-type substrate 41. (The corresponding structure with an n-type substrate will be understood without specific discussion.) The I/O pad 12 is connected to the $n^+$ diffusion 42 that is the drain region of the output pull up/pull down device 14. The $n^+$ diffusion 42 and the underlying substrate 41 cooperate to form diode 40. Diode 40 conducts in its forward direction when a negative ESD voltage appears at pad 12, as is conventional.

FIG. 2 shows the protected FET 20 formed as two structures arranged symmetrically on both sides of the $n^+$ diffusion 42 and pad 12. They conduct in parallel and thereby increase the capacity of the protection circuit to conduct an ESD current.

FETs 20 and FET 25 are each a lightly doped drain FET. Each has a drain diffusion 44, a source diffusion 45, a channel 46 and lightly doped diffusion 47, 48 extending into the channel from the source and drain. A gate electrode 49 and the underlying insulation are represented schematically.

Resistor 21 is formed between the drain $n^+$ diffusion 44 and 42. This diffusion is formed by the same process used for the lightly doped extensions 47 and 48 and it is given a similar shallow depth. This construction gives resistors 21 a short length for a given resistance and thereby makes the protection circuit more compact. (The resistance is proportional to the resistor length and inversely proportional to the resistor width.) Compared with the conventional structure, the resistors 21 are formed without increasing layout area, but the circuit provides a high level of protection against an ESD voltage.

The structure of FET 20 also forms the parasitic bipolar transistor 39. The $n^+$ diffusion forms the emitter, the $n^+$ diffusion forms the collector, and the intervening substrate forms the base region.

When an ESD voltage appears at pad 12, the ESD voltage will trigger the FET 20 to enter into the snapback region and it will conduct the ESD current. The voltage drop in diffusion 42 is larger than the voltage drop in diffusion 44 due to the voltage drop across the LDD $n^-$ resistor 21. Therefore, the diffusion 42 more easily undergoes breakdown than the diffusion 44 and is better able to act as the collector of a parasitic bipolar transistor 39. When the bipolar transistor 39 turns on in response the ESD voltage stress, it can conduct a larger the ESD current than the FET 21. By using the LDD $n^-$ resistor in this circuit, the parasitic bipolar transistor is more easily turned on than a parasitic bipolar transistor of the conventional output circuit structure.

Other Embodiments

In one embodiment of the invention, an $n^-$ well is formed under the $n^+$ pad diffusion 42 and extends symmetrically to the $n^+$ drain diffusions 44 of FETs 20.

From the description of the preferred embodiment of the invention and a modification of this embodiment, those skilled in the art will recognize modifications within the spirit of the invention and the intended scope of the claims.

I claim:

1. A semiconductor circuit device formed on a substrate (41), a pad (12) and I/O circuits (14, 15) formed on the device and connected to the pad and protected against an ESD voltage at the pad, wherein a protected output circuit (14) comprises, a first diffusion (42) underlying the pad for connecting the pad to components of the protected output circuit and a second diffusion (45) for connection to circuit ground, a plurality of pull down FETs (20) connected to turn on and off in response to a binary signal applied to their gates (49), pull down FETs having lightly doped source and drain diffusions (45, 47 and 44, 48), a plurality of resistors (21), each resistor connecting the drain terminal (44) of an associated pull down FET to the pad, whereby the FETs pull down the pad when the FETs turn on, the resistors being formed as lightly doped regions, and a parasitic bipolar transistor (39) having an emitter formed by said source diffusion (45) of the pull down fets, the first diffusion under the pad as its collector, and a intervening region of the substrate as its base.

2. The semiconductor circuit device of claim 1 wherein the device is formed in a p-type substrate and the first diffusion and the drain diffusions are $n^+$ diffusions and wherein an $n^-$ well underlying the first diffusion and the drain diffusions form the resistors.

3. The semiconductor circuit device of claim 1 wherein the resistors adjoin the first diffusion under the pad and the drain diffusion of the associated pull down FET.

4. The semiconductor circuit device of claim 3 wherein the protected output circuit is formed as pairs of pull down FETs arranged symmetrically with respect to the first diffusion underlying the pad.

5. The semiconductor circuit device of claim 4 wherein the device includes a point for connection to a power supply terminal (16), and the protected output circuit further comprises an FET (25) connected to pull up the pad voltage in response to a phase of a signal at the gates of the pull down FETs.

6. The semiconductor circuit device of claim 5 wherein the pull up FET (25) has one of its source and drain terminals connected to the power supply terminal and the pad respectively.

7. The semiconductor circuit device of claim 6 wherein the pull up FET and the pull down FETs are of like channel type and the pull up FET is connected to receive the Opposite phase of the signal at the gates of the pull down FETs.

8. The semiconductor circuit device of claim 7 wherein the pull down FETs have drain and source diffusions and wherein the device includes a diffusion forming a resistor connecting the drain of the pull up FET to the pad and wherein the diffusions of the pull up FET and the pull down FETs and the associated resistors are formed similarly in the substrate of the semiconductor device.

9. The semiconductor circuit device of claim 3 wherein the I/O circuits include an input circuit having input FETs (30, 31), a resistor (36) connecting the gates of the input FETs to the pad, and an ESD protection device (37) connected between ground and the common node of the gates and the resistor.

10. The semiconductor circuit device of claim 9 wherein the protection device (37) comprises an FET having its gate connected to ground.

* * * * *